United States Patent
Hiraishi et al.

(10) Patent No.: US 9,570,375 B2
(45) Date of Patent: Feb. 14, 2017

(54) SEMICONDUCTOR DEVICE HAVING SILICON INTERPOSER ON WHICH SEMICONDUCTOR CHIP IS MOUNTED

(71) Applicant: PS4 Luxco S.a.r.l., Luxembourg (LU)

(72) Inventors: Atsushi Hiraishi, Tokyo (JP); Toshio Sugano, Tokyo (JP); Yasuhiro Takai, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 465 days.

(21) Appl. No.: 13/926,462

(22) Filed: Jun. 25, 2013

(65) Prior Publication Data

US 2014/0001639 A1 Jan. 2, 2014

(30) Foreign Application Priority Data

Jun. 27, 2012 (JP) ................. 2012-144215

(51) Int. Cl.
*H01L 23/00* (2006.01)
*H01L 23/48* (2006.01)
(Continued)

(52) U.S. Cl.
CPC ......... *H01L 23/48* (2013.01); *H01L 23/49838* (2013.01); *H01L 23/50* (2013.01); *H01L 25/0652* (2013.01); *H01L 25/0657* (2013.01); *H01L 23/147* (2013.01); *H01L 23/49816* (2013.01); *H01L 23/49827* (2013.01); *H01L 23/49833* (2013.01); *H01L 23/5286* (2013.01); *H01L 24/13* (2013.01); *H01L 24/14* (2013.01); *H01L 24/16* (2013.01); *H01L 25/18* (2013.01);
*H01L 2224/0401* (2013.01); *H01L 2224/0557* (2013.01); *H01L 2224/05554* (2013.01); *H01L 2224/13025* (2013.01); *H01L 2224/14181* (2013.01); *H01L 2224/16145* (2013.01); *H01L 2224/16225* (2013.01);
(Continued)

(58) Field of Classification Search
CPC ...................................... H01L 23/48
See application file for complete search history.

(56) References Cited

U.S. PATENT DOCUMENTS

| 7,576,433 B2 | 8/2009 | Ishino et al. |
| 7,893,540 B2 | 2/2011 | Ishino et al. |

(Continued)

FOREIGN PATENT DOCUMENTS

| JP | 10-041637 A | 2/1998 |
| JP | 2006-024654 A | 1/2006 |

(Continued)

*Primary Examiner* — William Harriston

(57) ABSTRACT

Disclosed herein is a device that includes a silicon interposer having wiring lines on first and second wiring layers. The wiring lines includes first, second and third wiring lines provided on the first wiring layer and a fourth wiring line provided on the second wiring layer. The third wiring line is arranged between the first and second wiring lines on the first wiring layer. The fourth wiring line is overlapped with the third wiring line. Each of the first, second and fourth wiring lines conveys a power supply potential to first and second semiconductor chips mounted on the silicon interposer, and the third wiring line conveys a first signal communicated between the first and second semiconductor chips.

17 Claims, 10 Drawing Sheets

(51) Int. Cl.
  *H01L 23/50*   (2006.01)
  *H01L 25/065*  (2006.01)
  *H01L 23/14*    (2006.01)
  *H01L 23/498*   (2006.01)
  *H01L 23/528*   (2006.01)
  *H01L 25/18*    (2006.01)

(52) U.S. Cl.
  CPC ........... *H01L 2225/06513* (2013.01); *H01L 2225/06517* (2013.01); *H01L 2225/06541* (2013.01); *H01L 2225/06548* (2013.01); *H01L 2225/06572* (2013.01); *H01L 2924/00014* (2013.01); *H01L 2924/1431* (2013.01); *H01L 2924/1434* (2013.01); *H01L 2924/157* (2013.01); *H01L 2924/15311* (2013.01)

(56) References Cited

U.S. PATENT DOCUMENTS

| | | | |
|---|---|---|---|
| 7,923,809 | B2 | 4/2011 | Onda et al. |
| 8,298,940 | B2 | 10/2012 | Ishino et al. |
| 2009/0121344 | A1 | 5/2009 | Sunohara |
| 2009/0237186 | A1* | 9/2009 | Onda ................ H01P 3/003 333/238 |
| 2012/0273782 | A1* | 11/2012 | Goel ................ H01L 22/32 257/48 |
| 2013/0011967 | A1 | 1/2013 | Ishino et al. |

FOREIGN PATENT DOCUMENTS

| | | | |
|---|---|---|---|
| JP | 2007-012848 A | 1/2007 |
| JP | 2009-110983 A | 5/2009 |
| JP | 2009-231513 A | 10/2009 |

* cited by examiner

|  | T1 | T2 |
|---|---|---|
| Characteristic a | 2.66μm | 2.66μm |
| Characteristic b | 1.33μm | 1.33μm |
| Characteristic c | 1.00μm | 1.33μm |
| Characteristic d | 0.75μm | 1.33μm |

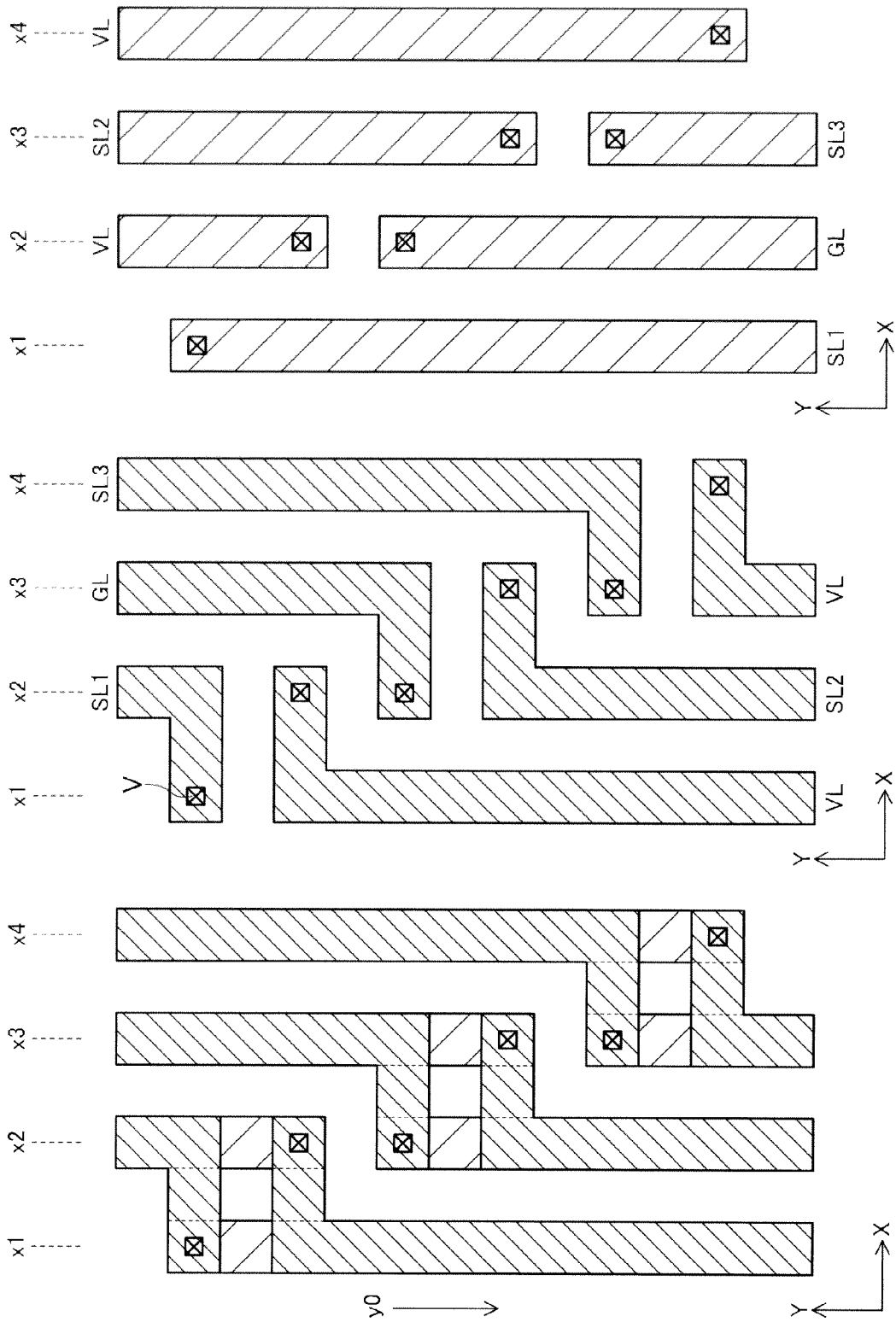

SEMICONDUCTOR DEVICE HAVING SILICON INTERPOSER ON WHICH SEMICONDUCTOR CHIP IS MOUNTED

BACKGROUND OF THE INVENTION

Field of the Invention

The present invention relates to a semiconductor device, and more particularly relates to a semiconductor device including a silicon interposer that is capable of transmitting a number of signals with a high signal quality.

Description of Related Art

In recent years, as a semiconductor device constituted by packaging a plurality of semiconductor chips, a semiconductor device using a silicon interposer has been attracting attention. Differently from conventional multichip packages, because the semiconductor device using a silicon interposer does not use bonding wires and the like for connection between semiconductor chips and the silicon interposer, this type of semiconductor device can realize higher density mounting and higher speed transmission of signals as compared to multichip packages (see Japanese Patent Application Laid-open Nos. 2007-12848 and 2009-110983).

However, in the silicon interposer described in Japanese Patent Application Laid-open Nos. 2007-12848 and 2009-110983, a current return path accompanied by transmission of signals is formed within a silicon substrate, and thus there is a problem that, when the frequency of a signal to be transmitted becomes high, the quality of the signal is degraded. Such a problem is not a serious issue when the length of signal lines arranged on the silicon interposer is relatively short. However, in a semiconductor device of a type in which a plurality of semiconductor chips are respectively mounted on different planes on a silicon interposer, the length of signal lines arranged on the silicon interposer becomes long, and the degradation of the signal quality becomes an unignorable level.

Furthermore, silicon interposers proposed in recent years have approximately 2000 signal lines arranged thereon, so that the crosstalk between these signal lines becomes a serious problem. As for the crosstalk between the signal lines, it also becomes more conspicuous as the length of the signal lines arranged on the silicon interposer becomes long. In order to reduce the crosstalk, it suffices that wiring layers formed on the silicon interposer are made to be multi-layered, that is, to be made three or more layers, thereby widening gaps between the lines. However, in this case, the manufacturing cost of the silicon interposer rises considerably. In connection to this problem, Japanese Patent Application Laid-open No. 2006-24654 describes a method of reducing the crosstalk on a silicon interposer; however, on the silicon interposer described in Japanese Patent Application Laid-open No. 2006-24654, it is difficult to form a large number of signal lines.

Although these are not related to a silicon interposer, methods described in Japanese Patent Application Laid-open Nos. H10-41637 and 2009-231513 are known as a crosstalk reduction method.

As described above, in conventional silicon interposers, due to a high resistance characteristic of a return path and crosstalk between signal lines, there has been a problem of degrading the signal quality with respect to high frequency signals. Therefore, there is a demand for a silicon interposer having a low resistance characteristic of a return path and having the crosstalk between signal lines reduced, and a semiconductor device using such a silicon interposer.

SUMMARY

In one embodiment, there is provided a semiconductor device that includes: a package substrate; a silicon interposer mounted on the package substrate, the silicon interposer including a plurality of wiring lines extending in a predetermined direction on first and second wiring layers, the wiring lines having first ends located at a first region and second ends located at a second region; a first semiconductor chip mounted on the first region of the silicon interposer so that the first semiconductor chip is electrically connected to the first ends of the plurality of wiring lines; and a second semiconductor chip mounted on the second region of the silicon interposer so that the second semiconductor chip is electrically connected to the second ends of the plurality of wiring lines. The plurality of wiring lines includes at least first, second and third wiring lines provided on the first wiring layer of the silicon interposer and a fourth wiring line provided on the second wiring layer of the silicon interposer. The third wiring line is arranged between the first and second wiring lines on the first wiring layer. The fourth wiring line is overlapped with the third wiring line. Each of the first, second and fourth wiring lines conveys a power supply potential to the first and second semiconductor chips, and the third wiring line conveys a first signal communicated between the first and second semiconductor chips.

In another embodiment, there is provided a semiconductor device that includes: a silicon interposer including a silicon substrate having first and second regions; a first semiconductor chip mounted on the first region of the silicon interposer; a second semiconductor chip mounted on the second region of the silicon interposer; a plurality of first signal lines and a plurality of first power supply lines formed on a first wiring layer provided over the silicon substrate, the first signal lines and the first power supply lines extending in a first direction and arranged in a second direction intersecting the first direction; and a plurality of second signal lines and a plurality of second power supply lines formed on a second wiring layer different from the first wiring layer provided over the silicon substrate, the second signal lines and the second power supply lines extending in the first direction and arranged in the second direction. Each of the first signal lines is overlapped with an associated one of the second power supply lines, and each of the second signal lines is overlapped with an associated one of the first power supply lines.

In still another embodiment, there is provided a semiconductor device that includes: a silicon interposer including a silicon substrate having first and second surface, a plurality of penetration electrodes penetrating through the silicon substrate, each of the penetration electrodes having a first end exposed on the first surface of the silicon substrate and a second end exposed on the second surface of the silicon substrate, and a plurality of wiring layers provided on the first surface of the silicon substrate, the plurality of wiring layers including at least first and second wiring layers on which a plurality of signal lines and a plurality of power supply lines are provided; and first and second semiconductor chips mounted on the first surface of the silicon substrate. At least one of the plurality of signal lines is connected between the first and second semiconductor chips. The plurality of signal lines include a first signal line provided on the first wiring layer. The plurality of power supply lines include first and second power supply lines provided on the first wiring layer, and include a third power supply line provided on the second wiring layer. The first signal line is surrounded by the first, second and third power supply lines.

BRIEF DESCRIPTION OF THE DRAWINGS

FIG. 4A shows a layout of a wiring layer L1, in which bump pads BP are formed, and FIG. 4B shows a layout of a wiring layer L2;

FIG. 6A shows a characteristic of a signal line SL formed in the wiring layer L1, and FIG. 6B shows a characteristic of a signal line SL formed in the wiring layer L2;

FIG. 8A is a perspective plan view showing both the wiring layers L1 and L2, FIG. 8B is a plan view showing the wiring layer L1, and FIG. 8C is a plan view showing the wiring layer L2;

FIGS. 9A to 9C are diagrams indicative of an embodiment of a layout in which a difference in characteristics of power supply lines VL and GL, as well as that of the signal lines SL, can be also offset, where FIG. 9A is a perspective plan view showing both the wiring layers L1 and L2, FIG. 9B is a plan view showing the wiring layer L1, and FIG. 9C is a plan view showing the wiring layer L2.

DETAILED DESCRIPTION OF THE EMBODIMENTS

Preferred embodiments of the present invention will be explained below in detail with reference to the accompanying drawings.

Figure 1:
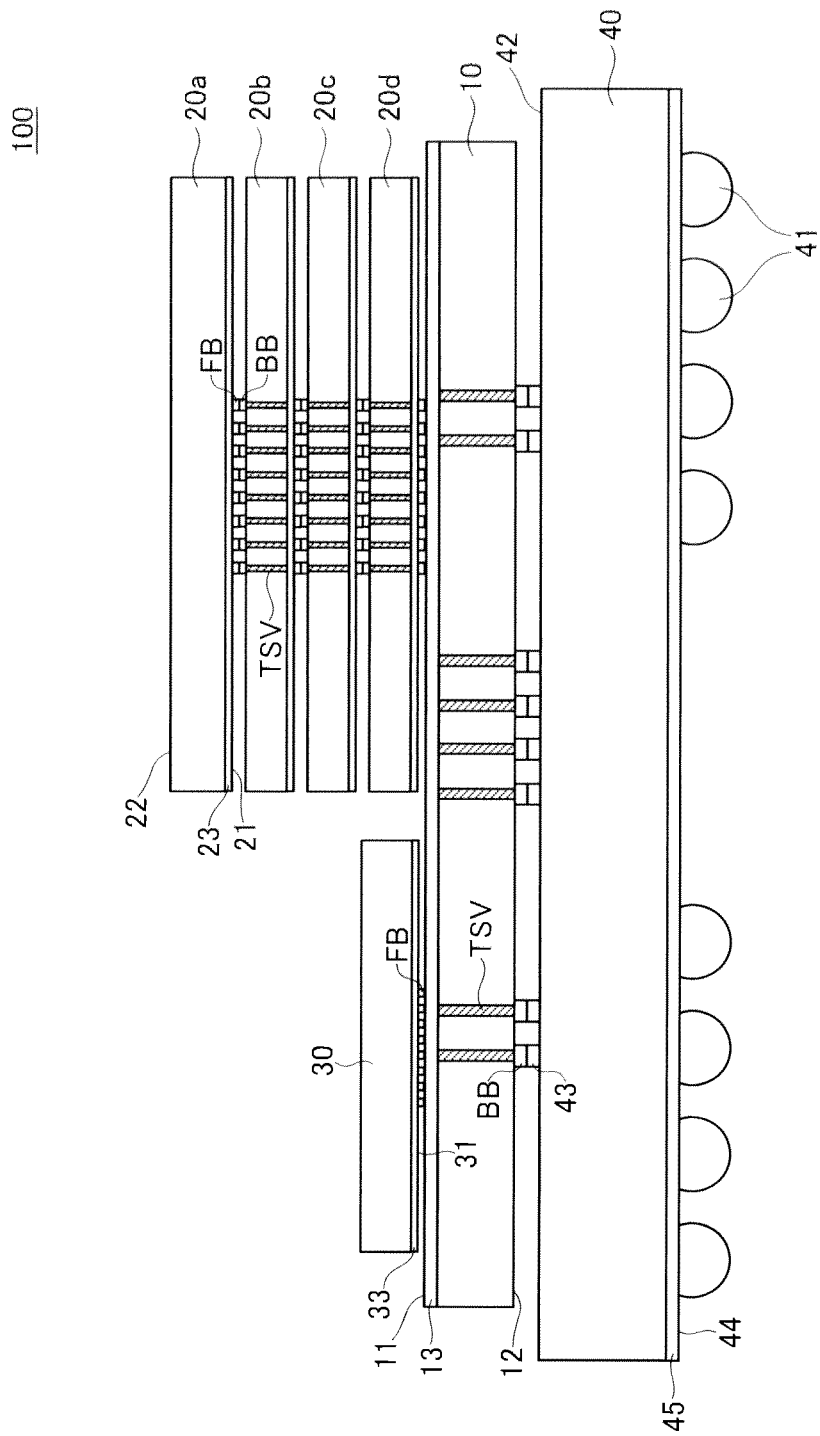
FIG. 1 is a schematic diagram showing an outline of a semiconductor device according to a first embodiment of the present invention.

Referring now to FIG. 1, the semiconductor device 100 according to the first embodiment of the present invention includes an interposer 10, for example, a silicon interposer 10 mounted on a package substrate 40 and a plurality of memory chips 20a to 20d and a logic chip 30 mounted on the silicon interposer 10. Each of the silicon interposer 10, the memory chips 20a to 20d, and the logic chip 30 is a semiconductor chip integrated on a semiconductor substrate such as silicon. The memory chips 20a to 20d are memory devices such as a DRAM (Dynamic Random Access Memory), and the logic chip 30 is a control device that controls the memory chips 20a to 20d. Meanwhile, the package substrate 40 is a circuit substrate formed of resin and the like, and the package substrate 40 maintains the mechanical strength of the semiconductor device 100 and functions as a re-wiring substrate that widens an electrode pitch. External terminals 41 are provided on the package substrate 40.

In the first embodiment, the memory chips 20a to 20d and the logic chip 30 are mounted on respectively different plane positions on a main surface 11 of the silicon interposer 10. The main surface 11 of the silicon interposer 10 represents a surface on a side where a multi-wiring layer 13 is formed. Two wiring layers (L1 and L2) described later are formed in the multi-wiring layer 13. Back-face bumps BB are arranged on a back surface 12 of the silicon interposer 10, and the respective back-face bumps BB are connected to the wiring layers (L1 and L2) in the multi-wiring layer 13 via through substrate vias TSV that are provided so as to penetrate the silicon interposer 10. TSV may be called penetration electrodes, penetration vias, through electrodes or through vias. The back-face bumps BB provided on the silicon interposer 10 are respectively connected to substrate bumps 43 arranged on a top surface 42 of the package substrate 40. The substrate bumps 43 are connected to a re-wiring layer 45 arranged on a bottom surface 44 of the package substrate 40 through a via conductor (not shown) that is provided so as to penetrate the package substrate 40. A re-wiring line (not shown) that widens an electrode pitch and is connected to the external terminal 41 is formed on the re-wiring layer 45.

The memory chips 20a to 20d are stacked in a predetermined area of the silicon interposer 10 in a face down manner. The face down manner represents a manner in which a main surface on which an electronic circuit such as a transistor is mounted faces downward, that is, a manner in which semiconductor chips are mounted such that the main surface faces the side of the silicon interposer 10. A circuit forming layer 23 is provided on the side of a main surface 21 of the memory chips 20a to 20d, and a memory cell array and the like are formed in the circuit forming layer 23. As shown in FIG. 1, a front-face bump FB is provided on the main surface 21 of the memory chips 20a to 20d, and the back-face bump BB is provided on a back surface 22 of the memory chips 20b to 20d, excluding the memory chip 20a that is on the topmost layer. The back-face bump RBB of a memory chip positioned on a lower layer and the front-face bump FB of a memory chip positioned on an upper layer are joined to each other. The front-face bump FB of the memory chip 20d positioned on the lowermost layer is connected to the multi-wiring layer 13 provided on the main surface 11 of the silicon interposer 10.

In the first embodiment, among the four memory chips 20a to 20d, the TSV that penetrates the corresponding chip is provided in the memory chips 20b to 20d, excluding the memory chip 20a that is on the topmost layer. With this configuration, a data bus, an address bus, a command bus and the like are in a wired-OR state among the four memory chips 20a to 20d. The TSV is not provided in the memory chip 20a on the topmost layer, because it is not necessary to provide any TSV therein due to the fact that these memory chips 20a to 20d are stacked in a face down manner. When the TSV is not provided in the memory chip 20a on the topmost layer, the thickness of the memory chip 20a can be larger as compared to that of the memory chips 20b to 20d, for example, and thus the strength of the semiconductor chip on the topmost layer, on which chip breakage is likely to occur, can be enhanced. Note that the TSV can be provided in the memory chip 20a on the topmost layer. In this case, it becomes possible to manufacture all of the memory chips 20a to 20d by the same process.

The logic chip 30 is also mounted on the silicon interposer 10 in a face down manner. A circuit forming layer 33 is provided on the side of a main surface 31 of the logic chip 30, and various logic circuits and the like are formed in the circuit forming layer 33. The front-face bump FB of the logic chip 30 is connected to the multi-wiring layer 13 provided on the main surface 11 of the silicon interposer 10.

As described above, the semiconductor device 100 according to the first embodiment has a configuration in which the memory chips 20a to 20d and the logic chip 30 are mounted on the silicon interposer 10 in a face down manner. However, the semiconductor device according to the present invention is not limited to this configuration. These semiconductor chips can be stacked in a face up manner, and semiconductor chips mounted on a silicon interposer in a face down manner and those mounted on a silicon interposer in a face up manner can be mixed. The face up manner represents a manner in which a main surface on which an electronic circuit such as a transistor is mounted faces upward, that is, a manner in which semiconductor chips are mounted such that the main surface faces a side opposite to the silicon interposer 10. Moreover, in the first embodiment, none of bonding wires are provided for connecting the logic chip 30 with the interposer 10 and connecting the memory chips 20 with the interposer 10.

Figure 2:
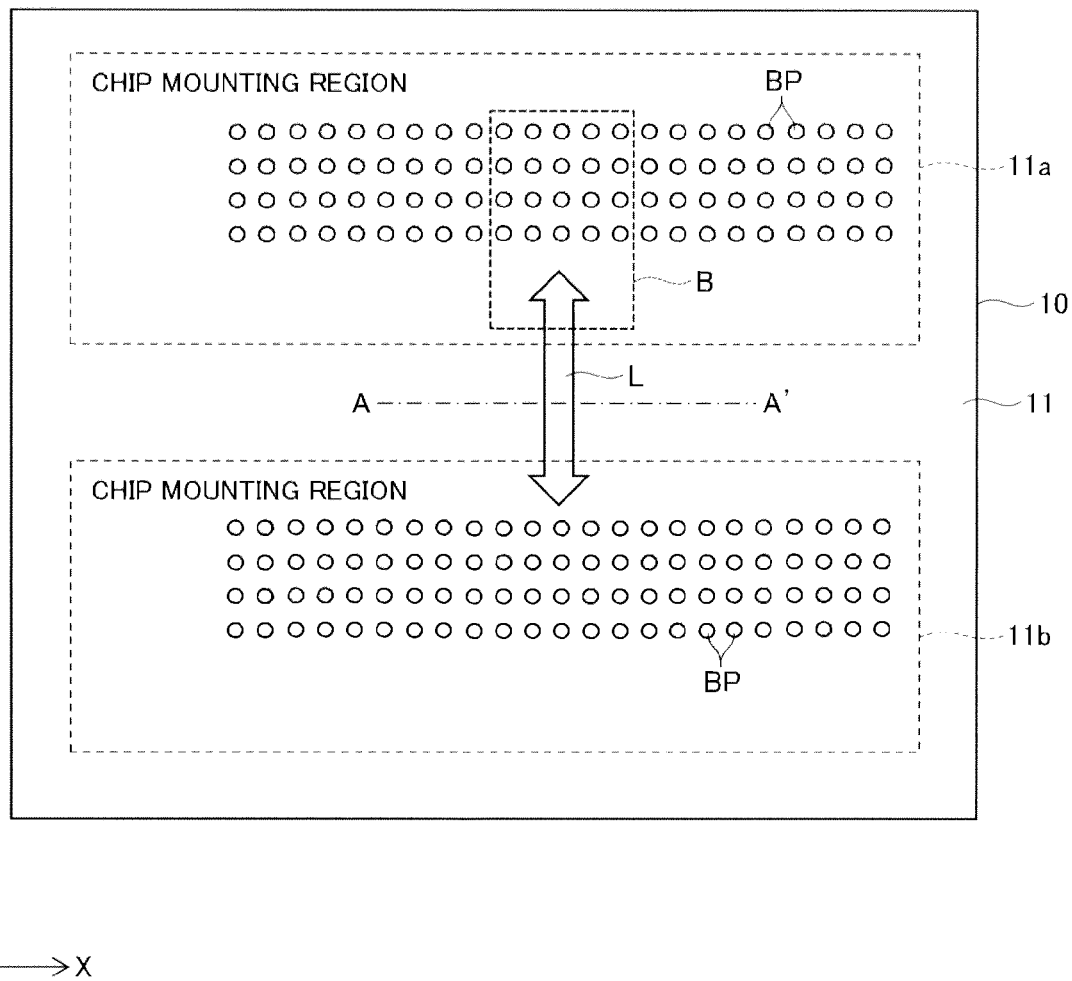
FIG. 2 is a schematic plan view for explaining a layout of a main surface of a silicon interposer shown in FIG. 1.

Turning to FIG. 2, two chip mounting regions 11a and 11b are defined on the main surface 11 of the silicon interposer 10. The chip mounting region 11a is a region where the memory chips 20a to 20d are mounted, and the chip mounting region 11b is a region where the logic chip 30 is mounted. A number of bump pads BP are formed on both the chip mounting regions 11a and 11b. Among these bump pads BP, the bump pads BP provided in the chip mounting region 11a are joined to the front-face bumps FB of the memory chip 20d, and the bump pads BP provided in the chip mounting region 11b are joined to the front-face bumps FB of the logic chip 30. While these bump pads BP are connected to the external terminals 41 shown in FIG. 1, as indicated by reference character L shown in FIG. 2, these bump pads BP in the both regions are connected to each other by a line in the silicon interposer 10. In this manner, in the first embodiment, because the chip mounting regions 11a and 11b are present on a plane different to each other in the silicon interposer 10, the length of lines for connecting the bump pads BP provided in these regions becomes relatively long, such as 10 mm.

Figure 3:
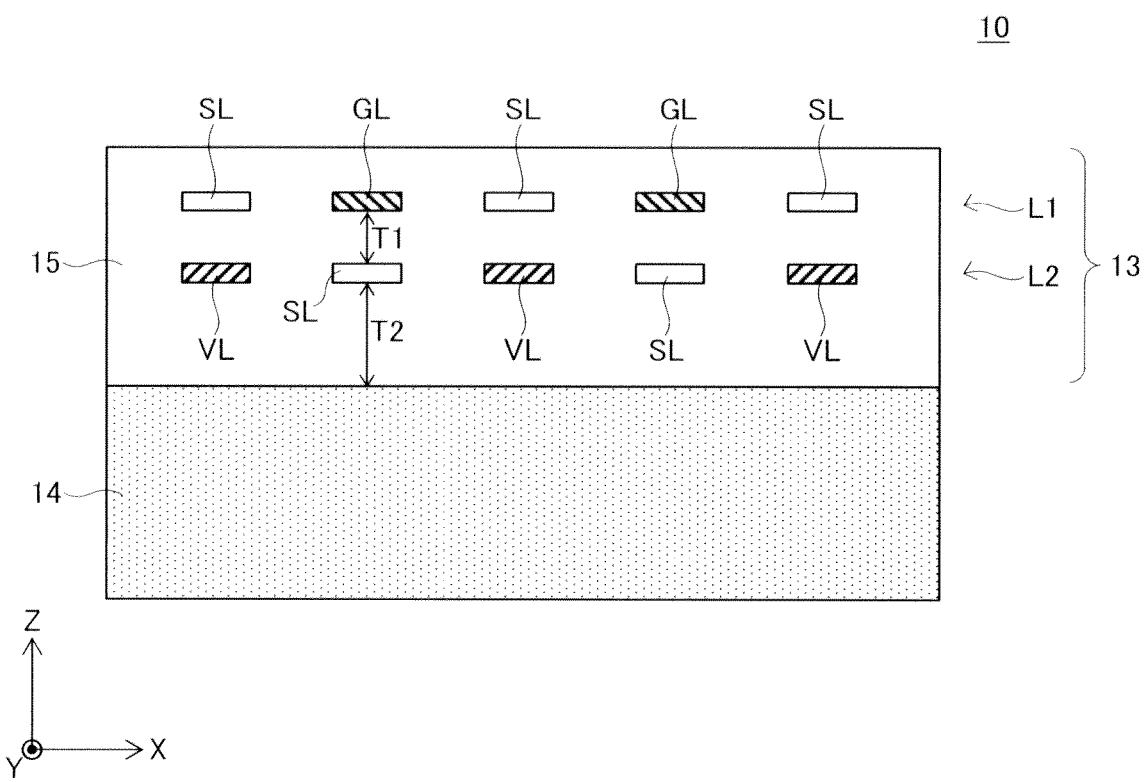
FIG. 3 is a cross-sectional view along a line A-A' shown in FIG. 2.

Turning to FIG. 3, the silicon interposer 10 used in the first embodiment includes a silicon substrate 14 and the multi-wiring layer 13 formed on a main surface of the silicon substrate 14. The multi-wiring layer 13 is constituted by the two wiring layers L1 and L2. The wiring layer L1 is a wiring layer positioned on a top layer, and the wiring layer L2 is a wiring layer positioned on a bottom layer. An interlayer dielectric film 15 formed of a material such as a silicon dioxide film is provided between the silicon substrate 14 and the wiring layer L2 and between the wiring layers L1 and L2.

A plurality of lines extending in a depth direction (a Y direction) in FIG. 3 are arranged at an equal interval in the wiring layers L1 and L2. To explain more specifically, in the wiring layer L1, power supply lines GL and signal lines SL are arranged alternately in an X direction, and in the wiring layer L2, power supply lines VL and the signal lines SL are arranged alternately in the X direction. The power supply lines VL are lines for supplying a power supply potential VDD at a high-order side, and the power supply wires GL are lines for supplying a power supply potential GND at a low-order side. Therefore, the power supply potentials are supplied to the memory chips 20a to 20d and the logic chip 30 via these power supply lines VL and GL. The signal lines SL are lines for transmitting signals input to the memory chips 20a to 20d and the logic chip 30 or signals output from the memory chips 20a to 20d and the logic chip 30.

With this configuration, the signal lines SL formed in the wiring layer L1 are sandwiched by the power supply lines GL on both sides in the X direction (that is, both the left and right sides). Similarly, the signal lines SL formed in the wiring layer L2 are sandwiched by the power supply lines VL on both sides in the X direction (that is, both the left and right sides).

Furthermore, the signal lines SL formed in the wiring layer L1 and the signal lines SL formed in the wiring layer L2 shift by one pitch. Therefore, the signal lines SL formed in the wiring layer L1 and the power supply lines VL formed in the wiring layer L2 overlap in a plan view (that is, in a Z direction), and the signal lines SL formed in the wiring layer L2 and the power supply lines GL formed in the wiring layer L1 overlap in a plan view (that is, the Z direction).

As a result, the respective signal lines SL are surrounded by the power supply lines VL and GL from three directions, that is, from the both sides in the X direction and one side in the Z direction. With this configuration, because these power supply lines VL and GL function as return paths of a current accompanied by transmission of signals via the respective signal lines SL, it is possible to achieve a higher signal quality as compared to conventional silicon interposers in which return paths are formed in a silicon substrate. Furthermore, because the respective signal lines SL are surrounded by the power supply lines VL and GL, these power supply lines VL and GL function as a shield, and the crosstalk between the signal lines SL is reduced.

In the example shown in FIG. 3, while the power supply lines GL are arranged in the wiring layer L1 and the power supply lines VL are arranged in the wiring layer L2, arrangements of the power supply lines VL and GL are not limited thereto. Therefore, the power supply lines VL and GL can be mixed in a certain wiring layer.

Figure 4B:
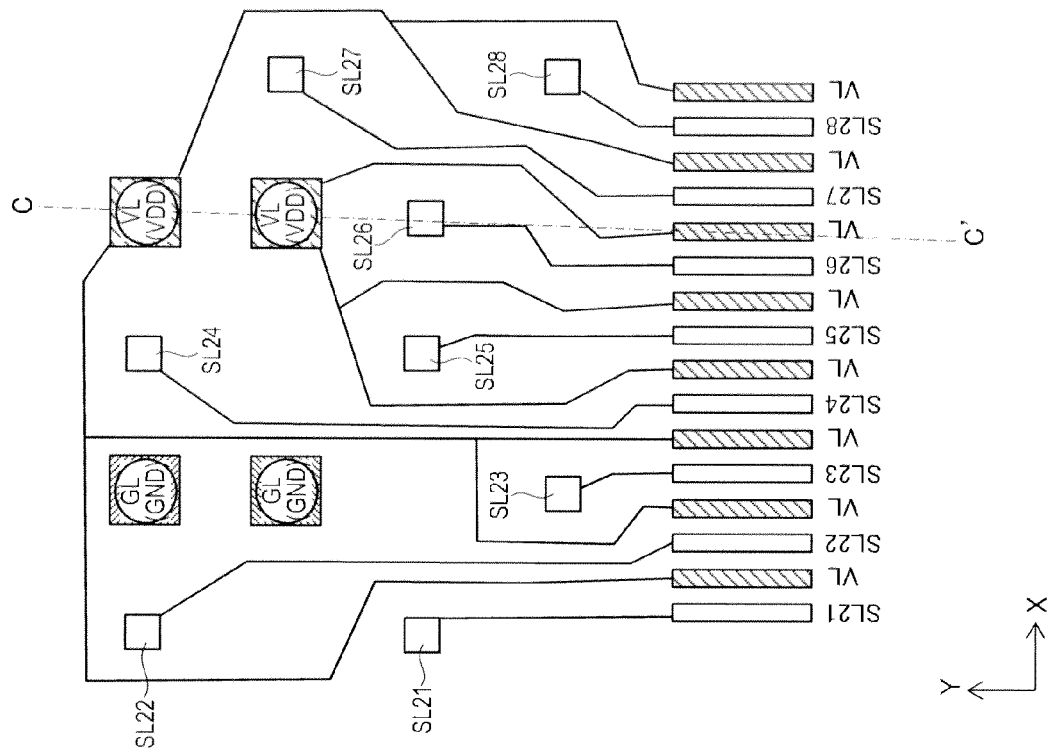
FIGS. 4A and 4B are schematic enlarged views indicative of an embodiment of a region B shown in FIG. 2, where
Figure 4A:
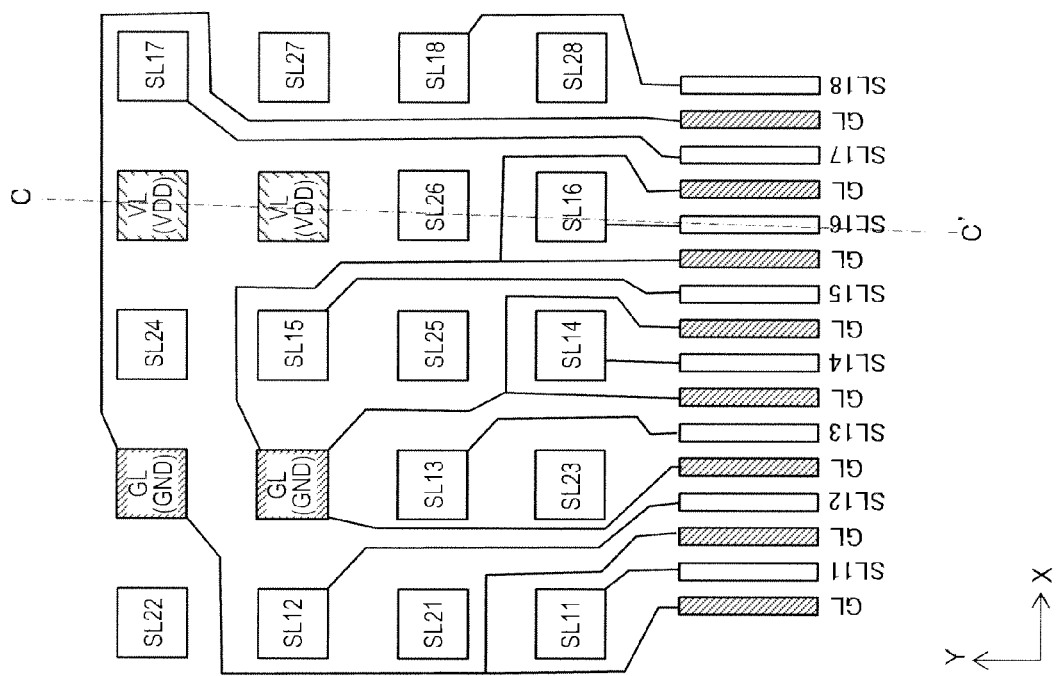

Turning to FIG. 4A, among twenty bump pads BP arranged in the region B shown in FIG. 2, sixteen bump pads BP are for signals, other two bump pads BP are for VDD, and still other two bump pads BP are for GND. In FIGS. 4A and 4B, reference characters SL11 to SL18 and SL21 to SL28 are respectively denoted to the bump pads BP for signals and signal lines connected thereto.

Among the sixteen bump pads for signals SL11 to SL18 and SL21 to SL28, the eight bump pads SL11 to SL18 are extracted to the wiring layer L1, and the rest of eight bump pads SL21 to SL28 are extracted to the wiring layer L2 through a via conductor V. Bump pads for GND are extracted to the wiring layer L1, and the bump pads for VDD are extracted to the wiring layer L2 via a through-hole electrode. The power supply lines VL and GL extracted to each of the wiring layers L1 and L2 are branched into plural lines in the corresponding wiring layer. Subsequently, in the wiring layer L1, the signal lines SL11 to SL18 extending in the Y direction as shown in FIG. 4A and the power supply lines GL are arranged alternately. Furthermore, in the wiring layer L2, the signal lines SL21 to SL28 extending in the Y direction as shown in FIG. 4B and the power supply lines VL are arranged alternately. Further, between the wiring layers L1 and L2, the power supply lines VL and GL and the signal lines SL are laid out to overlap in a plan view.

Figure 5:
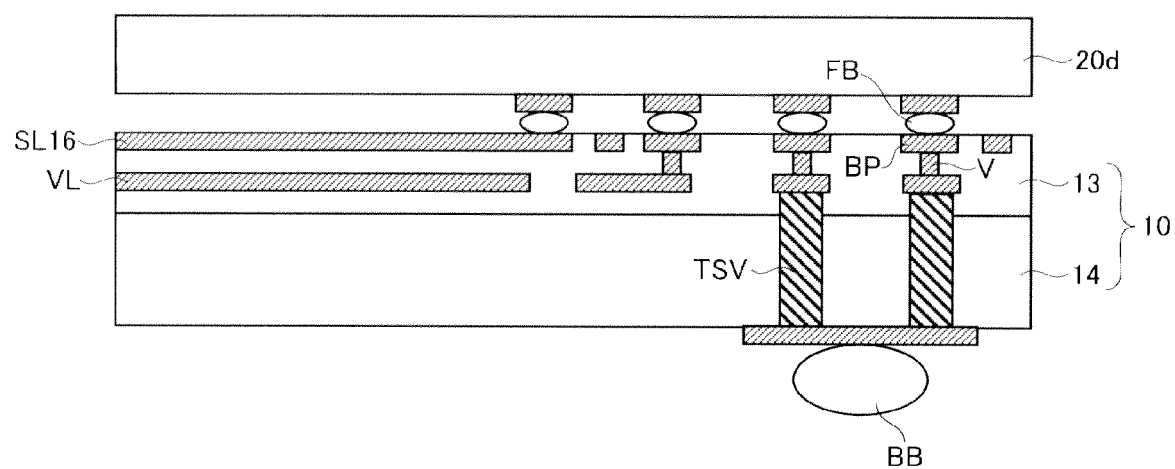
FIG. 5 is a schematic cross-sectional view along a line C-C' shown in FIGS. 4A and 4B.

Furthermore, the silicon interposer 10 according to the first embodiment includes the TSVs. In the regions shown in FIGS. 4A and 4B, the TSVs are arranged in a position where the bump pads BP for VDD and the bump pads BP for GND overlap in a plan view. Among these TSVs, two TSVs that are arranged in a position where these TSVs are overlapped in a plan view with the bump pads BP for VDD are shown in FIG. 5. These TSVs TSV are commonly connected to the same back-face bump BB provided on the back surface 12 of the silicon interposer 10. The bump pads BP and the TSVs are connected to each other by the via conductor V, which is provided so as to penetrate the multi-wiring layer 13. With such a direct-connection configuration using the TSVs, the power supply resistance between the package substrate 40 and the memory chips 20a to 20d is considerably reduced. Meanwhile, any TSV is not arranged in a position where the TSVs are overlapped in a plan view with bump pads BP for signal lines. The reason for this is because the memory chips 20a to 20d transmit and receive signals to and from the logic chip 30. The logic chip 30 transmits and receives signals to and from outside via the TSVs provided in the silicon interposer 10. The operational power supply of the memory chips 20a to 20d and the logic chip 30 is supplied from outside via the silicon interposer 10 and the package substrate 40.

Although not particularly limited thereto, in the first embodiment, the distance between the silicon substrate 14 and the wiring layer L2 is designed to be larger than the distance between the wiring layer L1 and the wiring layer L2. That is, as shown in FIG. 3, as the distance between the wiring layer L1 and the wiring layer L2 is designated as T1 and the distance between the silicon substrate 14 and the wiring layer L2 is designated as T2, it is designed as T1<T2. This is because when the distance T2 is short, attenuation of signals becomes conspicuous in the signal lines SL provided in the wiring layer L2. In order to reduce the attenuation of signals, it suffices that the distances T1 and T2 are designed to be large and wiring gaps are designed to be wide. However, when the distances T1 and T2 are designed to be large, warpage of the silicon substrate 14 may become too large to control due to the difference in thermal expansion coefficients of the silicon substrate 14 and of the interlayer dielectric film 15. Furthermore, when the number of signal lines is large, it is difficult to design wiring gaps to be wide.

Figure 6A:
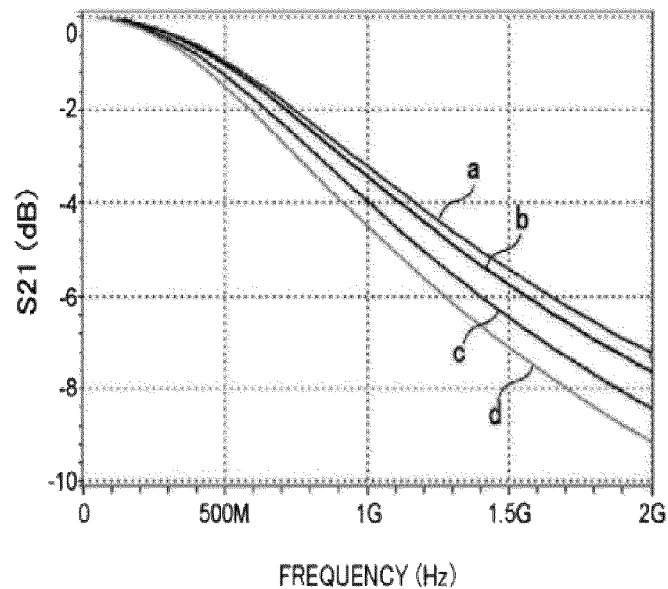
FIGS. 6A and 6B are graphs indicative of an embodiment of results of simulations of a relationship between distances T1 and T2 shown in FIG. 3 and a pass characteristic (S21) of a signal line SL, where
Figure 6B:
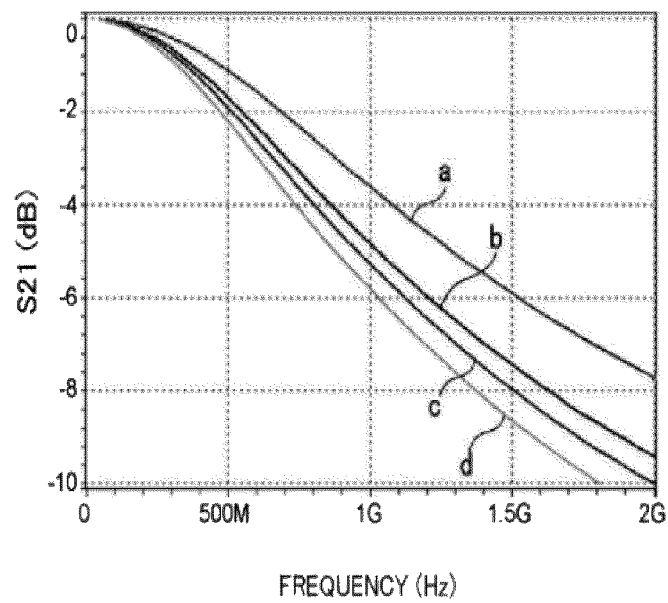
Figures 7A, 7B:
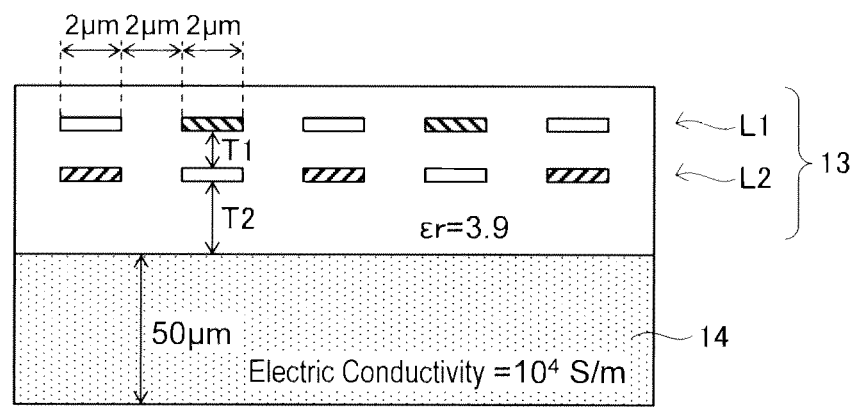
FIGS. 7A and 7B are a table and a schematic cross-sectional view indicative of an embodiment of simulation conditions of characteristics a to d shown in FIGS. 6A and 6B, respectively.

Turning to FIGS. 6A, 6B, 7A and 7B, in these simulations, as shown in FIG. 7B, both the wiring width and wiring space of the wiring layers L1 and L2 are set to be 2 μm, the wiring length thereof is set to be 10 mm, the silicon substrate thickness is set to be 50 μm, the relative permittivity $\in r$ of a silicon dioxide film constituting an interlayer dielectric film is set to be 3.9, and the electric conductivity of the silicon substrate is set to be $10^4$ S/m. The impurity concentration of the silicon substrate having the electric conductivity of $10^4$ S/m is approximately $1 \times 10^{18}$ cm$^{-3}$.

As shown in FIGS. 6A and 6B, it is understood that the larger the distances T1 and T2, the better high frequency characteristics thereof. In addition, degradation of the high frequency characteristics due to reduction of the distances T1 and T2 is more conspicuous in the wiring layer L2, which is a lower layer. In consideration of such a result, it is desirable that the distance T2 is designed to be larger than the distance T1.

As described above, signal transmission characteristics of the wiring layers T1 and T2 are slightly different from each other. Therefore, there is a case where the quality of signals varies by whether each signal passes through the signal wiring SL formed in which wiring layer. Such a difference in the characteristics becomes particularly conspicuous when the distance T2 is short. Therefore, when such a difference in the characteristics becomes a problem, it is preferable to offset the difference in the characteristics by having a layout in which signals pass through both the wiring layers L1 and L2. The layout in which the difference in the characteristics can be offset is explained below.

Figure 8C:
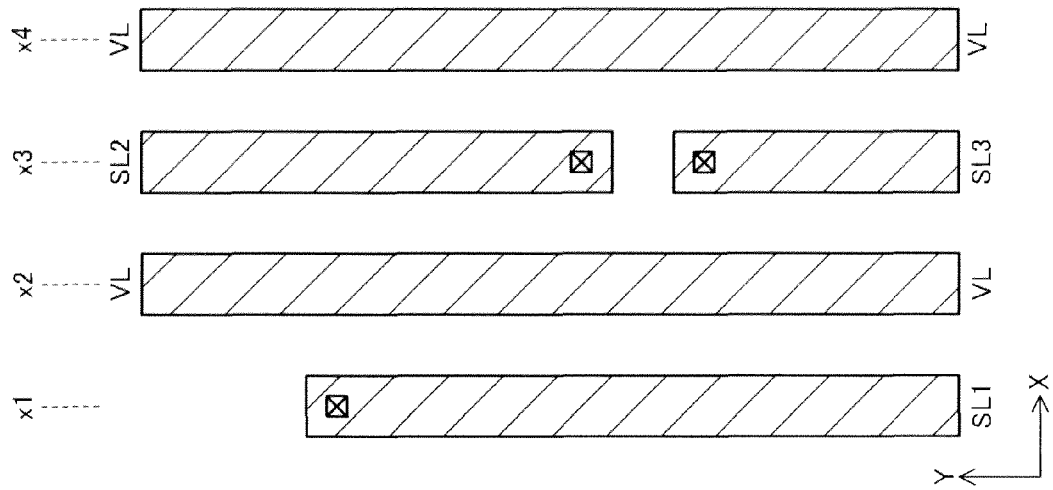
FIGS. 8A to 8C are diagrams indicative of an embodiment of a layout in which a difference in characteristics of the signal lines SL can be offset, where
Figure 8B:
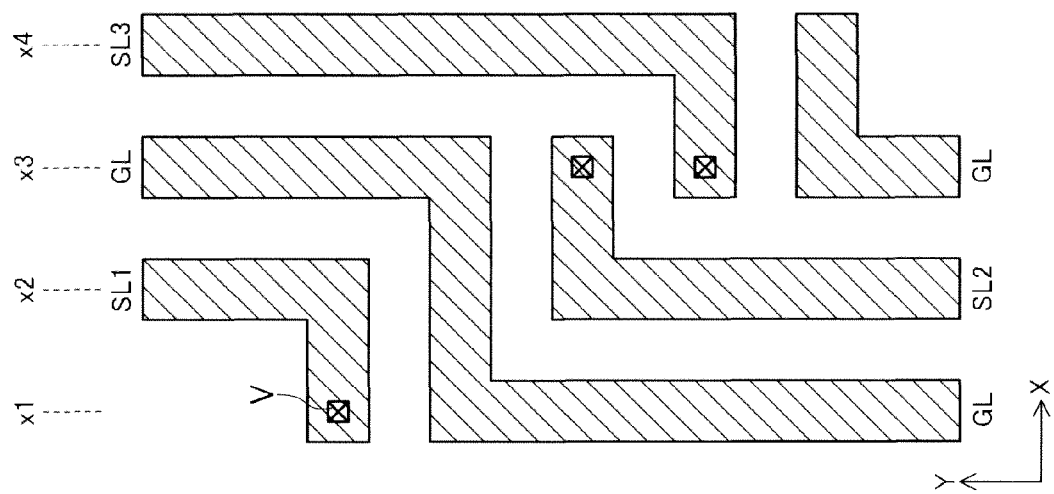
Figure 8A:
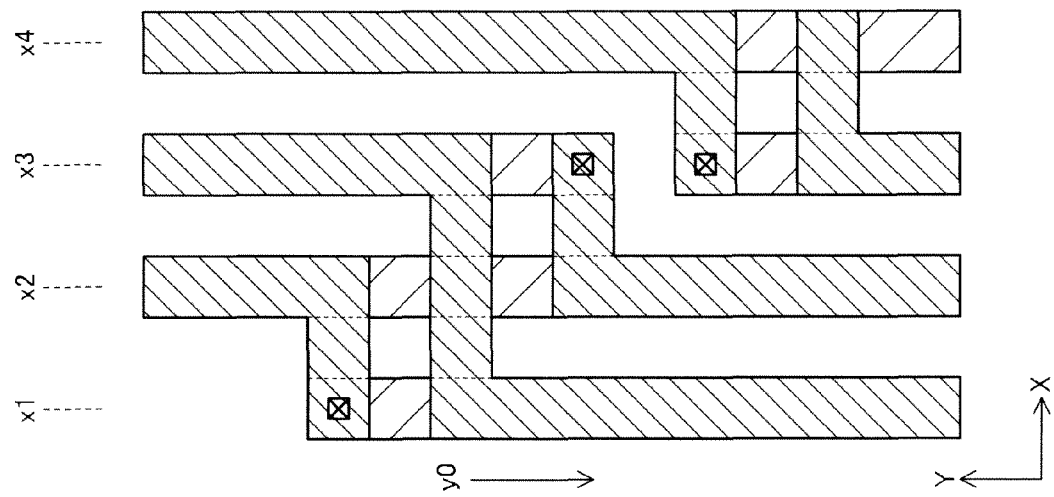

Turning to FIGS. 8A to 8C, in this layout, as for signal lines SL1 and SL3, the forming position thereof is switched from the wiring layer L1 to the wiring layer L2 towards the direction of an arrow y0, and as for a signal line SL2, the forming position thereof is switched from the wiring layer L2 to the wiring layer L1 towards the direction of the arrow y0. Switching of the wiring layers, that is, connection between the wiring layers L1 and L2, is performed through the via conductor V that penetrates through an interlayer dielectric film provided between the wiring layers L1 and L2. In a plan view, the signal line SL1 shifts from a coordinate x2 to a coordinate x1, the signal line SL2 shifts from a coordinate x3 to the coordinate x2, and the signal line SL3 shifts from a coordinate x4 to the coordinate x3 towards the direction of the arrow y0. That is, as for the respective signal lines SL, the wiring layers L1 and L2 are switched, and the X-coordinate thereof shifts by one pitch. In this example, while the wiring layers of the power supply lines VL and GL are not switched, along with the switching of the wiring layers of the signal lines SL, the power supply lines GL formed in the wiring layer L1 are in a crank shape. The crank shape is formed to prevent interference between the power supply lines GL and the via conductor V.

As described above, in the layouts shown in FIGS. 8A to 8C, because the forming positions of the signal lines SL are switched between the wiring layers L1 and L2, the respective signals pass through both the wiring layers L1 and L2, and thus variations of the quality of the signals due to characteristic differences between wiring layers are offset. In order to offset the characteristic differences more accurately, it is preferable that a wiring part formed in the wiring layer L1 and a wiring part formed in the wiring layer L2 are set to have substantially the same length by performing switching of the wiring layers in an intermediate position of respective lines.

Turning to FIGS. 9A to 9C, in this layout, a wiring pair is formed by the power supply line VL and the signal line SL1 or the signal line SL3, and another wiring pair is formed by the signal line SL2 and the power supply line GL. Positions of the two lines forming these pairs are alternately switched. In order to realize the switching, while the layout of the signal lines SL1 to SL3 shown in FIGS. 9A to 9C are basically the same as the layout shown in FIGS. 8A to 8C, in addition to those shown in FIGS. 8A to 8C, the wiring layers of the power supply lines VL and GL are also switched. Specifically, as for the power supply line GL, the forming position thereof is switched from the wiring layer L1 to the wiring layer L2 towards the direction of the arrow y0, and as for the power supply line VL, the forming position thereof is switched from the wiring layer L2 to the wiring layer L1 towards the direction of the arrow y0, and further, and the X-coordinates thereof shift by one pitch.

With this configuration, according to the layout shown in FIGS. 9A to 9C, not only characteristic differences between the signal lines SL, but also a relative positional relationship between the signal lines and power supply lines that function as return current paths of the signal lines SL can be maintained. Therefore, there is also an advantage such that variations of characteristics due to a change of a part of return current paths can be prevented.

As explained above, in the semiconductor device 100 according to the first embodiment, the respective signal lines SL provided in the silicon interposer 10 are surrounded by the power supply lines VL and GL from three directions. Therefore, it is possible to achieve a higher signal quality as compared to conventional silicon interposers in which return paths are formed within a silicon substrate, and it is also possible to reduce the crosstalk between the signal lines SL. Furthermore, because only two layers suffice as the wiring layers to be formed in the silicon interposer 10, it becomes possible to reduce the manufacturing cost of the silicon interposer 10. Note that this does not mean that the number of the wiring layers is limited to two, but three or more wiring layers can be formed in the silicon interposer 10. Further, according to the first embodiment, there is another advantage such that a robust power supply line network between chips can be formed by the power supply lines VL and GL.

Figure 10:
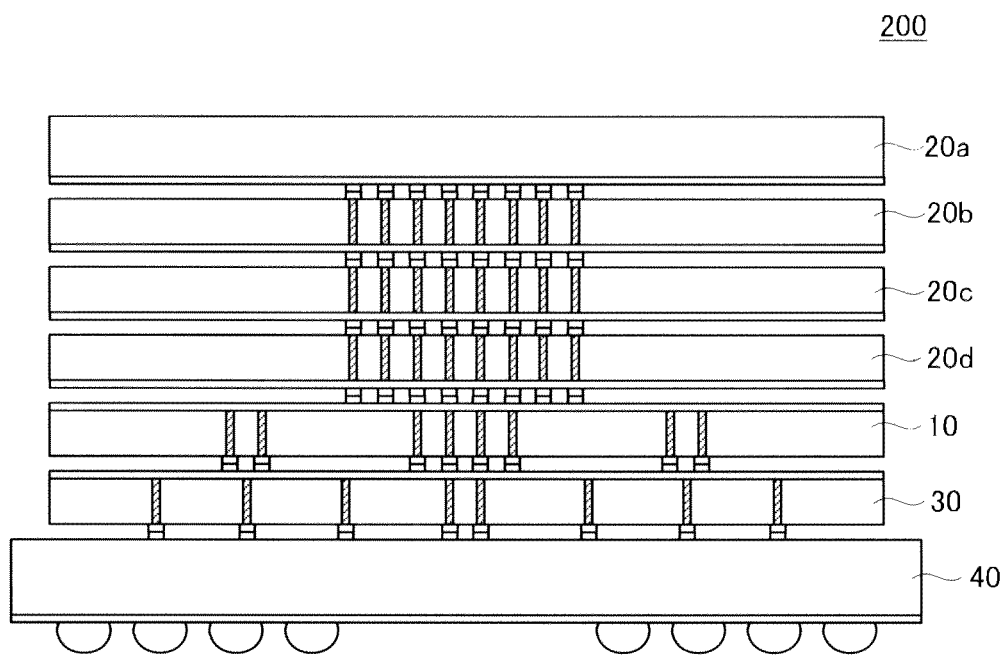
FIG. 10 is a schematic diagram showing an outline of a semiconductor device according to a second embodiment of the present invention.

Turning to FIG. 10, the semiconductor device 200 according to the second embodiment has a structure in which the logic chip 30, the silicon interposer 10, and the memory chips 20a to 20d are stacked on the package substrate 40. That is, in the semiconductor device 200 according to the second embodiment, the memory chips 20a to 20d and the logic chip 30 are mounted to be on both surfaces of the silicon interposer 10 such that these chips sandwich the silicon interposer 10, unlike the structure of the first embodiment described above, in which the memory chips 20a to 20d and the logic chip 30 are mounted on respectively different plane positions on the silicon interposer 10. Even in the semiconductor device 200 having such a structure, when a bus width (the number of I/O lines) of lines that connect the memory chips 20a to 20d and the logic chip 30 is very large, the number of signal lines SL to be formed in the silicon interposer 10 becomes very large. However, even in this case, by using the silicon interposer 10 explained in the first embodiment, a high signal quality can be achieved while suppressing an increase of the manufacturing cost.

It is apparent that the present invention is not limited to the above embodiments, but may be modified and changed without departing from the scope and spirit of the invention.

For example, in the embodiments described above, while an example of a semiconductor device including the memory chips 20a to 20d and the logic chip 30 in a mixed manner has been explained, the type and combination of semiconductor chips included in a semiconductor device in a mixed manner are not limited to any specific ones. Therefore, the present invention can be also applied to a semiconductor device having a plurality of logic chips of different types stacked thereon.

Furthermore, in the embodiments described above, while an example of using the silicon interposer 10 has been explained, materials other than silicon can be also used as the material of the interposer. As the material other than silicon, it is possible to use other semiconductor materials, as well as an inorganic insulating material such as quartz glass or an organic insulating material such as a resin material.

Furthermore, the interposer 10 may includes buffers which intervene the wiring layers SL provided between the memory chips 20a to 20d and the logic chip 30 to re-drive signals on the wiring layers SL.

What is claimed is:
1. A semiconductor device comprising:
   a package substrate;
   a silicon interposer mounted on the package substrate, the silicon interposer including a plurality of wiring lines extending in a predetermined direction on first and second wiring layers, the wiring lines having first ends located at a first region and second ends located at a second region;
   a first semiconductor chip mounted on the first region of the silicon interposer so that the first semiconductor chip is electrically connected to the first ends of the plurality of wiring lines; and
   a second semiconductor chip mounted on the second region of the silicon interposer so that the second semiconductor chip is electrically connected to the second ends of the plurality of wiring lines, wherein the plurality of wiring lines includes at least first, second and third wiring lines provided on the first wiring layer of the silicon interposer and a fourth wiring line provided on the second wiring layer of the silicon interposer, the third wiring line is arranged between the first and second wiring lines on the first wiring layer, the fourth wiring line is overlapped with the third wiring line, each of the first, second and fourth wiring lines conveys a power supply potential to the first and second semiconductor chips, and the third wiring line conveys a first signal communicated between the first and second semiconductor chips.

2. The semiconductor device as claimed in claim 1, wherein each of the first and second wiring lines conveys a first power supply potential to the first and second semiconductor chips, and the fourth wiring line conveys a second power supply potential different from the first power supply potential to the first and second semiconductor chips.

3. The semiconductor device as claimed in claim 2, wherein the plurality of the wiring lines further includes fifth and sixth wiring lines provided on the second wiring layer of the silicon interposer, the sixth wiring line is arranged between the fourth and fifth wiring lines on the second wiring layer, the fifth wiring line conveys the second power supply potential to the first and second semiconductor chips, and the sixth wiring line conveys a second signal different from the first signal communicated between the first and second semiconductor chips.

4. The semiconductor device as claimed in claim 3, wherein the plurality of the wiring lines further includes a seventh wiring line on the first wiring layer and electrically connected to the sixth wiring line, each of the plurality of wiring lines includes first and second sections between the first and second ends, the third wiring line is overlapped with the fourth wiring line in the first section, the seventh wiring line is overlapped with the fourth wiring line and arranged between the first and second wiring lines in the second section.

5. The semiconductor device as claimed in claim 4, wherein the plurality of the wiring lines further includes an eighth wiring line on the second wiring layer and electrically connected to one of the first and second wiring lines, each of the plurality of wiring lines further includes a third section between the first and second ends, the eighth wiring line is overlapped with one of the third and seventh wiring lines in the third section.

6. The semiconductor device as claimed in claim 1, wherein the silicon interposer includes a silicon substrate, the second wiring layer is provided over the silicon substrate, the first wiring layer is provided over the second wiring layer, and a distance between the silicon substrate and the second wiring layer is greater than a distance between the first wiring layer and the second wiring layer.

7. The semiconductor device as claimed in claim 1, wherein the silicon interposer includes a silicon substrate and a plurality of penetration electrodes penetrating through the silicon substrate.

8. The semiconductor device as claimed in claim 7, wherein the penetration electrodes are electrically connected between the package substrate and at least a part of the plurality of wiring lines.

9. The semiconductor device as claimed in claim 1, wherein the first semiconductor chip comprises a memory device and the second semiconductor chip comprises a control device that controls the memory device.

10. The semiconductor device as claimed in claim 1, further comprising a third semiconductor chip stacked on the first semiconductor chip.

11. The semiconductor device as claimed in claim 10, wherein the first semiconductor chip includes a plurality of penetration electrodes penetrating therethrough, the second and third semiconductor chips are electrically connected via the plurality of wiring lines and the penetration electrodes.

12. A semiconductor device comprising:
a silicon interposer including a silicon substrate having first and second regions;
a first semiconductor chip mounted on the first region of the silicon interposer;
a second semiconductor chip mounted on the second region of the silicon interposer;
a plurality of first signal lines and a plurality of first power supply lines formed on a first wiring layer provided over the silicon substrate, the first signal lines and the first power supply lines extending in a first direction and arranged in a second direction intersecting the first direction; and
a plurality of second signal lines and a plurality of second power supply lines formed on a second wiring layer different from the first wiring layer provided over the silicon substrate, the second signal lines and the second power supply lines extending in the first direction and arranged in the second direction, wherein each of the first signal lines is overlapped with an associated one of the second power supply lines, and each of the second signal lines is overlapped with an associated one of the first power supply lines,
wherein each of the first power supply lines conveys a first power supply potential to the first and second semiconductor chips, and each of the second power supply lines conveys a second power supply potential different from the first power supply potential to the first and second semiconductor chips.

13. The semiconductor device as claimed in claim 12, wherein the second wiring layer is provided over the silicon substrate, the first wiring layer is provided over the second wiring layer, and a distance between the silicon substrate and the second wiring layer is greater than a distance between the first wiring layer and the second wiring layer.

14. A semiconductor device comprising:
a silicon interposer including:
a silicon substrate having first and second surface;
a plurality of penetration electrodes penetrating through the silicon substrate, each of the penetration electrodes having a first end exposed on the first surface of the silicon substrate and a second end exposed on the second surface of the silicon substrate; and
a plurality of wiring layers provided on the first surface of the silicon substrate, the plurality of wiring layers including at least first and second wiring layers on which a plurality of signal lines and a plurality of power supply lines are provided; and
first and second semiconductor chips mounted on the first surface of the silicon substrate, wherein
at least one of the plurality of signal lines is connected between the first and second semiconductor chips,
the plurality of signal lines include a first signal line provided on the first wiring layer,
the plurality of power supply lines include first and second power supply lines provided on the first wiring layer, and include a third power supply line provided on the second wiring layer, and
the first signal line is surrounded by the first, second and third power supply lines.

15. The semiconductor device as claimed in claim 14, wherein at least two of the power supply lines are electrically connected to the first end of a predetermined one of the penetration electrodes in common.

16. The semiconductor device as claimed in claim 14, wherein the first signal line includes first and second sections, the first section of the first signal line is provided on the first wiring layer, and the second section of the first signal line is provided on the second wiring layer.

17. The semiconductor device as claimed in claim 14, wherein the second wiring layer is provided over the silicon substrate, the first wiring layer is provided over the second wiring layer, and a distance between the silicon substrate and the second wiring layer is greater than a distance between the first wiring layer and the second wiring layer.

* * * * *